137-13.

SR 10-05-71 OR 3,610,261

[11] 3,610,261

[72] Inventor Robert F. Turek
Silver Spring, Md.

[21] Appl. No. 837,119

[22] Filed June 27, 1969

[45] Patented Oct. 5, 1971

[73] Assignee Bowles Fluidics Corporation

[54] METHOD AND APPARATUS FOR VARYING THE GAIN OF A FLUIDIC AMPLIFIER
10 Claims, 3 Drawing Figs.

[52] U.S. Cl. 137/13, 137/81.5

[51] Int. Cl. F15c 1/14

[50] Field of Search 137/81.5, 13

[56] References Cited

UNITED STATES PATENTS

| | | | |
|---|---|---|---|
| 3,186,422 | 6/1965 | Boothe | 137/81.5 |
| 3,279,488 | 10/1966 | Jones | 137/81.5 |
| 3,460,556 | 8/1969 | Sowers | 137/81.5 |
| 3,426,781 | 2/1969 | Neuman | 137/81.5 |

*Primary Examiner*—William R. Cline
*Attorney*—Rose & Edell

ABSTRACT: A variable gain fluidic amplifier of the stream interaction type employs an out-of-phase secondary control port for selectively modifying the power stream. In one embodiment the power stream is selectively deflected out of the plane of the primary control ports to vary the proportion of power stream fluid receivable at the outlet passages. In another embodiment the power stream is selectively compressed or pinched against a cover plate whereby the configuration of the velocity profile of the power stream is controllably varied.

INVENTOR
ROBERT F. TUREK

BY Hurvitz, Rose & Greene
ATTORNEYS

METHOD AND APPARATUS FOR VARYING THE GAIN OF A FLUIDIC AMPLIFIER

BACKGROUND OF THE INVENTION

The present invention relates to variable gain fluidic amplifiers of the stream interaction type.

Prior art approaches to achieving variable gain in stream interaction type fluidic amplifiers suffer from either or both of the following disadvantages: a limited range of gain adjustment; and the necessity for more than one fluidic element to achieve variable gain. In a typical prior art approach a gain control signal and an input signal are applied to respective control ports of an amplifier. The gain control signal determines the portion of the power stream velocity profile which is to be received by the amplifier outlet passage for given input signal levels. Since the bell-configured velocity profile has differently sloping sections, the gain control signal controllably directs different ones of these sections towards the outlet passage. In this manner the gain (output pressure changes versus input pressure changes) of the amplifier is varied as a function of the gain control signal.

One problem with this approach is that the bell configuration of the power stream velocity profile is fixed. Some of the differently sloping sections of the profile are relatively short and consequently the gain corresponding to the profile slope in these sections is effective over a relatively limited range of input signal. Furthermore, if the input signal is a differentially varying pressure (double-ended), a pair of amplifier elements are required to amplify respective halves of the signal. A third amplifier must then be provided to sum the output pressures of the amplifier pair. Accuracy therefore depends on matching the amplifier pair. In addition, several critical bias adjustments are necessary in this approach.

It is therefore an object of the present invention to provide a single variable gain fluidic element having a wide range of gain adjustment.

SUMMARY OF THE INVENTION

According to one aspect of the present invention, an out-of-plane control port is provided in a stream interaction amplifier and permits diversion of the power stream perpendicular to the deflection plane of the primary control ports. A controllable portion of the power stream is thus defected out of receiving capability of the receivers, thereby controlling the gain (output pressure change versus input pressure change) of the amplifier.

In a second embodiment, out-of-plane diversion of the power stream is prevented by a cover plate. The out-of-plane control port in this case issues a gain control stream which compresses or pinches the power stream against the cover plate to controllably vary the configuration of the power stream velocity profile. With increasing gain control pressure the velocity profile changes from one with a steep velocity gradient to one with a shallower gradient, until finally, in the extreme, to a double-hump configuration capable of providing a negative gain characteristic.

BRIEF DESCRIPTION OF THE DRAWINGS

The above and still further objects, features and advantages of the present invention will become apparent upon consideration of the following detailed description of specific embodiments thereof, especially when taken in conjunction with the accompanying drawings, wherein.

DESCRIPTION OF THE PREFERRED EMBODIMENTS

Figures 1, 2:
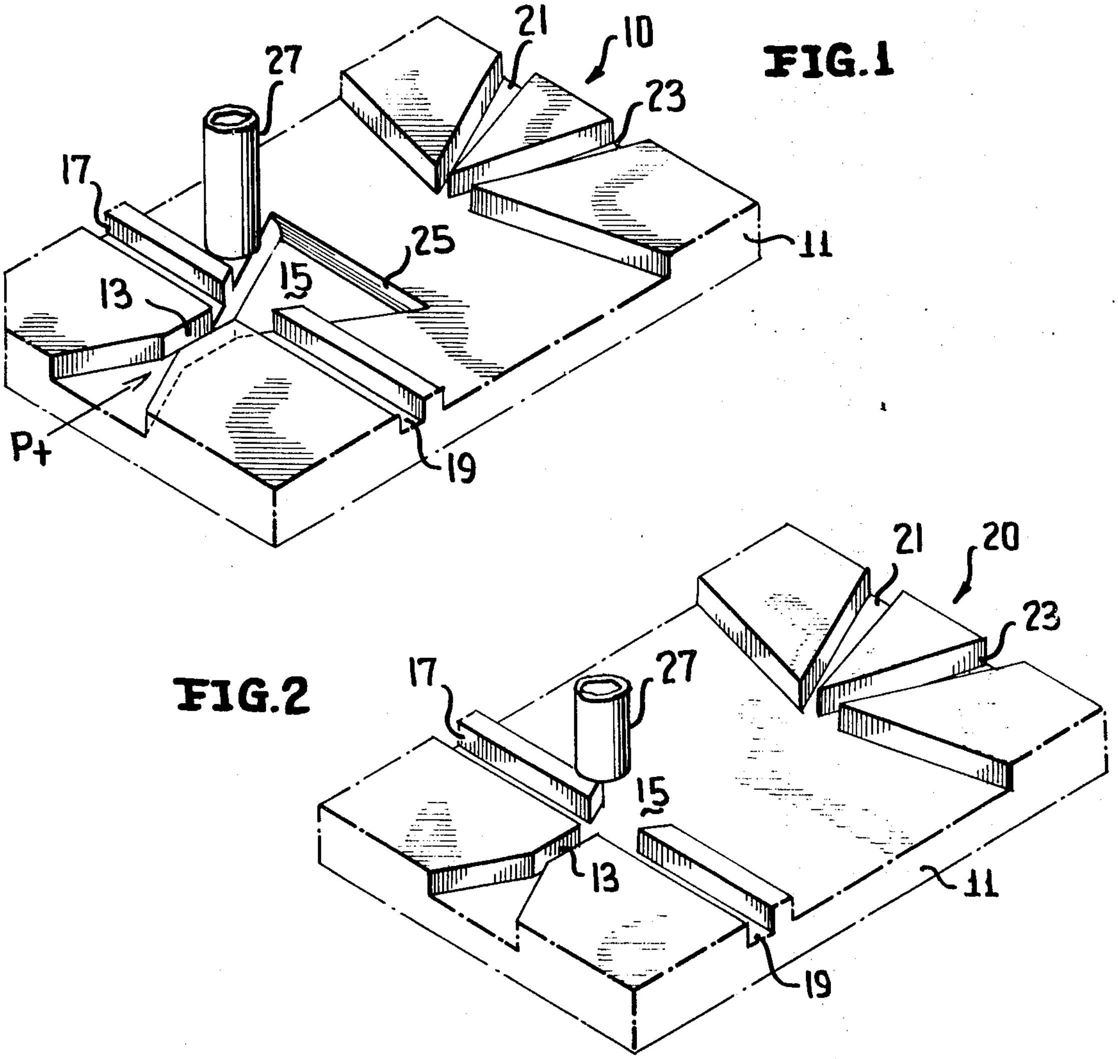
FIG. 1 is a diagrammatic illustration of one embodiment of a variable gain fluidic amplifier according to the principles of the present invention.
FIG. 2 is a diagrammatic illustration of a second embodiment of a variable gain fluidic amplifier according to the principles of the present invention.

Referring specifically to FIG. 1 of the accompanying drawings, there is illustrated a variable gain fluidic amplifier 10 of the stream interaction type. Various coplanar nozzles and passages comprising amplifier 10 are formed in one surface of a plate 11, which surface is adapted to be covered with a further plate in fluidtight relationship. The further plate is not illustrated in FIG. 1 in order to render the essential features of the amplifier clearly visible.

A power nozzle 13 is adapted to receive pressurized fluid P+ applied thereto and issues a power stream of fluid into an interaction region 15. At the upstream end of interaction region 15 there are provided left and right control ports 17 and 19 respectively disposed on opposite sides of power nozzle 13. Left and right outlet passages, 21 and 23 respectively have ingress openings at the downstream end of interaction region 15. The sidewalls of interaction region 15 are set back throughout the distance between the control ports and outlet passages to prevent boundary layer effects from deflecting the power stream toward one or the other sidewall.

Figure 3:
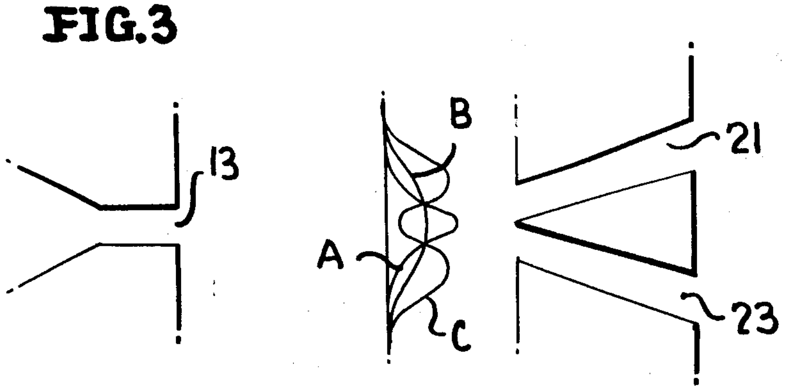
FIG. 3 is a further diagrammatic illustration of the embodiment of FIG. 2, indicating various power stream velocity profile configurations achievable to produce gain variations.

The amplifier as thus far described in a conventional proportional fluidic amplifier of the stream interaction type in which power nozzle 13, control ports 17, 19 and outlet passages 21, 23 are coplanar. Fluid signals applied to control ports 17, 19 produce respective control streams which deflect the power stream in the plane of the amplifier as a function of the relative strengths of the fluid signals. The respective portions of the power stream received by outlet passages 21 and 23 is a measure of power stream deflection and therefore the differential pressure appearing across the outlet passages is a function of the difference between the fluid input signals. This function is determined, in part, by the velocity profile of the power stream in the vicinity of the ingress openings of the outlet passage. The velocity profile assumes a "bell" configuration, such as that designated by the letter "*A*" in FIG. 3, producing a gain characteristic (output pressure change versus input pressure change) of similar configuration.

A hole or aperture 25 is defined through plate 11 at the upstream end of interaction region 15. Aperture 25 communicates between the interaction region 15 and ambient pressure, and is configured to vent portions of the power stream which are deflected downwardly (as viewed in FIG. 1). A gain control port 27 is disposed above the power stream in the vicinity of control ports 17 and 19 and is adapted to respond to pressurized fluid applied thereto for issuing a gain control stream perpendicular to the plane of amplifier 10. The gain control stream is directed at the power stream and therefore directs portions of the power stream our of interaction region 15 to ambient via aperture 25. Control port 27 is typically formed through the cover plate (not illustrated) adapted to fit over and seal amplifier 10 formed in plate 11.

The configuration of aperture 25 is such as to readily conduct power stream fluid to ambient when the latter is deflected out of the plane of amplifier 10 by the gain control stream. For example, in order to assure that power stream flow so deflected is efficiently vented, aperture 25 is made generally divergent in a downstream direction, permitting venting of downwardly deflected flow when the power stream is simultaneously deflected by control streams issuing from ports 17 and 19. In addition, the downstream defining wall of aperture 25 may be configured so as to scoop the downwardly deflected portions of the power stream, conducting the scooped fluid away from the interaction region and thereby minimizing any interference between the out-of-plane fluid and the remaining power stream flow in amplifier 10.

Gain variation is achieved in amplifier 10 by virtue of the fact that the total portion of the power stream received by outlet passages 21, 23 is selectively variable with the strength of the gain control applied to gain control port 27. The greater the gain control signal, the smaller is the power stream flow reaching the outlet passages and consequently the smaller is the output pressure variation produced in response to input signal variations at control passages 17 and 19. When no gain control signal is present, gain is at a maximum because maximum power stream flow reaches the outlet passages and therefore greater output pressure variations are experienced in response to input pressure variations.

Referring now to FIG. 2 of the accompanying drawings there is illustrated a variable gain amplifier 20, constituting an alternative embodiment of the present invention. Amplifier 20 is configured substantially identical to amplifier 10 with the exception that no aperture 25 is provided in plate 11 of amplifier 20. In all other respects amplifiers 10 and 20 are the same, like components of each being designated by the same reference numerals.

The effect of eliminating aperture 25 in amplifier 20 is to cause the gain control stream from gain control port 27 to compress or pinch the power stream against plate 11. This compression or pinching effect causes the velocity profile of the power stream to spread out with increasing gain control signal. To better understand this effect, reference is made to FIG. 3 in which three power stream velocity profiles, A, B and C are illustrated. Profile A is the normal bell-configured profile, having a relatively high maximum velocity with a relatively sharp velocity dropoff transversely of the power stream. Velocity profile A is assumed in the absence of a control signal from gain control port 27. For this profile, the gain of amplifier 20 is at a maximum.

Velocity profile B is also bell-configured but somewhat more spread out than profile A. Profile B is assumed in response to a gain control stream issued from port 27 which tends to pinch or flatten the power stream against plate 11. The maximum stream velocity is thus decreased as compared to profile A and the transverse velocity dropoff is much more gradual. Consequently changes in control signals at control ports 17 and 19 produce significantly smaller changes in output pressure at passages 21 and 23 than was the case for profile A. The gain produced by profile B is thus significantly less than that produced by profile A.

Further increase in the gain control signal tends to compress the power stream further, spreading the profile even more. Eventually, further gain control signal increase tends to impede the central portion of the power stream to a significantly greater extent than the sides of the power stream, producing the "double-hump" profile configuration designated as C in FIG. 3. Profile C contains substantially greater velocity components in its two side humps than at the stream center, and therefore is able to result in a negative gain characteristic for amplifier 20. By negative gain it is meant that for like input pressure variations, profile C produces output pressure changes in an opposite sense to output pressure changes produced by profiles A and B. More specifically, consider the case where no gain control signal is applied. Velocity profile A is applicable under these circumstances. With zero pressure differential across control ports 17 and 19 the power stream is centered between outlet passages 21 and 23 supplying substantially equal pressures to these passages and providing zero output differential pressure. If the input signal at control port 19 is increased, the power stream is deflected to the left, increasing the pressure in left outlet passage 21 and decreasing the pressure in right outlet passage 23. A positive differential pressure change is thus produced across outlet passages 21 and 23.

Consider now the case where maximum gain control signal is applied to gain control port 27 to produce velocity profile C. When the input differential pressure across control ports 17 and 19 is zero the power stream is centered and outlet passages 21 and 23 receive equal pressures. If the input signal at control port 19 is increased, the power stream is deflected to the left and the pressure in outlet passage 23 increases relative to the pressure in outlet passage 21. This is due to the fact that outlet passage 23 receives higher velocity portions of the right hump of profile C while outlet passage 21 at first receives decreasing velocity portions of the left hump, then the null, and then slowly increasing velocity portions of the right hump. The differential pressure across outlet passages 21 and 23 thus changes in a negative sense and thus provides a negative gain characteristic for amplifier 20.

In the embodiments described above, the maximum gain is approximately that of amplifier minus the variable gain producing components. Gain control signals applied to gain control port may originate automatically in a system environment or may be preselected for a given amplifier application.

While I have described and illustrated specific embodiments of my invention, it will be clear that variations of the details of construction which are specifically illustrated and described may be resorted to without departing from the true spirit and scope of the invention as defined in the appended claims.

I claim:

1. A variable gain fluidic amplifier formed in a surface of a plate and including means for issuing a power stream of fluid, means for selectively deflecting said power stream in a first plane, output means for receiving portions of said power stream as a function of power stream deflection in said first plane, and variable gain control means for deflecting selectively variable portions of said power stream out of said first plane and away from said receiver means, wherein said gain control means comprises:
   a gain control port responsive to pressurized fluid applied thereto for issuing a gain control stream in deflecting relationship with said power stream, said gain control port being disposed to issue said gain control stream from outside said first plane and perpendicularly toward said power stream to deflect said power stream toward said plate, and a vent opening defined through said plate for receiving varying portions of said power stream as a function of said gain control stream.

2. A variable gain fluidic amplifier comprising:
   means for issuing a power stream of fluid along a planar surface;
   means for selectively deflecting said power stream along said surface;
   output means for selectively receiving portions of said power stream as a function of power stream deflection along said planar surface; and
   gain control means for selectively compressing said power stream against said planar surface and changing the portions of said power stream received by said output means upon deflection of said power stream along said surface.

3. The variable gain fluidic amplifier according to claim 2 wherein said power stream has a predetermined velocity profile in the vicinity of said output means and wherein said gain control means selectively alters said predetermined velocity profile by compressing said power stream against said surface.

4. The variable gain fluidic amplifier according to claim 3 wherein said gain control means comprises a gain control nozzle for issuing a gain control stream perpendicular to said surface.

5. A fluidic amplifier comprising:
   a power nozzle responsive to application of pressurized fluid thereto for issuing a power stream of fluid along a planar surface;
   input means for selectively deflecting said power stream in a first plane parallel to said planar surface;
   output means for receiving a varying portion of said power stream as a function of power stream deflection in said first plane; and
   gain control means for selectively varying the portion of said power stream received by said output means independently of said input means, said gain control means comprising means for issuing a gain control stream of fluid into interaction relationship with said power stream, said gain control stream having a flow component perpendicular to said planar surface.

6. The fluidic amplifier according to claim 5 wherein gain control means comprises a gain control nozzle oriented to issue said gain control stream perpendicular to said first plane.

7. A variable gain fluidic amplifier comprising:

means for issuing a power stream of fluid along a surface;

means for selectively deflecting said power stream along said surface;

output means for selectively receiving portions of said power stream as a function of power stream deflection along said surface;

gain control means for selectively compressing said power stream against said surface and changing the portions of said power stream received by said output means upon deflection of said power stream along said surface;

wherein said power stream has a predetermined velocity profile in the vicinity of said output means, wherein said gain control means selectively alters said predetermined velocity profile by compressing said power stream against said surface, wherein said gain control means comprises a gain control nozzle for issuing a gain control stream perpendicular to said surface, wherein said power stream is issued along a surface parallel to said first plane, and wherein said gain control stream selectively compresses said power stream against said surface to alter said predetermined velocity profile as a function of said gain control stream.

8. A fluidic amplifier comprising:

a power nozzle responsive to application of pressurized fluid thereto for issuing a power stream of fluid;

input means for selectively deflecting in said power stream in a first plane;

output means for receiving a varying portion of said power stream as a function of power stream deflection in said first plane; and gain control means for selectively varying the portion of said power stream received by said output means independently of said input means, said gain control means comprising means for issuing a gain control stream of fluid into interaction relationship with said power stream from a location outside of said first plane, wherein said gain control means comprises a gain control nozzle to issue said gain control stream perpendicular to said first plane, wherein said power stream is issued along a surface parallel to said first plane, said surface having a vent opening defined therein, and wherein said gain control stream is oriented to selectively deflect portions of said power stream through said vent opening.

9. The method of varying the gain of a fluidic amplifier of the type wherein a power stream flows along a planar surface and is selectively deflected parallel to said planar surface relative to a receiver comprising the steps of: issuing a fluid power stream with a predetermine velocity profile along said planar surface; and selectively altering the configuration of said velocity profile by compressing said power stream.

10. The method of claim 9 wherein compression of said power stream is effected by a control stream intersecting said power stream upstream of said receiver and having a flow component perpendicular to said planar surface.